United States Patent
Shigaki et al.

(10) Patent No.: US 10,508,174 B2
(45) Date of Patent: Dec. 17, 2019

(54) SILICON-CONTAINING COATING AGENT FOR REVERSING PLANARIZATION PATTERN

(71) Applicant: NISSAN CHEMICAL INDUSTRIES, LTD., Tokyo (JP)

(72) Inventors: Shuhei Shigaki, Toyama (JP); Hiroaki Yaguchi, Toyama (JP); Makoto Nakajima, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 104 days.

(21) Appl. No.: 15/758,965

(22) PCT Filed: Aug. 26, 2016

(86) PCT No.: PCT/JP2016/075066
§ 371 (c)(1),
(2) Date: Mar. 9, 2018

(87) PCT Pub. No.: WO2017/043344
PCT Pub. Date: Mar. 16, 2017

(65) Prior Publication Data
US 2019/0040207 A1     Feb. 7, 2019

(30) Foreign Application Priority Data

Sep. 9, 2015  (JP) ................. 2015-177306

(51) Int. Cl.
| | | |
|---|---|---|
| C08G 77/38 | (2006.01) |
| C09D 183/04 | (2006.01) |
| G03F 7/11 | (2006.01) |
| G03F 7/20 | (2006.01) |
| G03F 7/40 | (2006.01) |
| H01L 21/027 | (2006.01) |
| C09D 7/40 | (2018.01) |
| C09D 7/65 | (2018.01) |

(52) U.S. Cl.
CPC ............... *C08G 77/38* (2013.01); *C09D 7/40* (2018.01); *C09D 7/65* (2018.01); *C09D 183/04* (2013.01); *G03F 7/11* (2013.01); *G03F 7/20* (2013.01); *G03F 7/40* (2013.01); *H01L 21/027* (2013.01)

(58) Field of Classification Search
CPC .......... C08G 77/38; C07F 7/1836; C07F 7/04; C07F 7/045; C07F 7/06; C07F 7/07
See application file for complete search history.

(56) References Cited

U.S. PATENT DOCUMENTS

2014/0323677 A1*   10/2014   Kitamura ............. C08F 299/08
                                                                  528/32

FOREIGN PATENT DOCUMENTS

| | | |
|---|---|---|
| JP | 2006-299251 A | 11/2006 |
| JP | 2006-336010 A | 12/2006 |
| JP | 2009-301007 A | 12/2009 |
| JP | 2010-020109 A | 1/2010 |
| JP | 2010-519398 A | 6/2010 |
| JP | 2010-151923 A | 7/2010 |
| JP | 2011-118373 A | 6/2011 |
| JP | 2014-106298 A | 6/2014 |
| WO | 2011/155365 A1 | 12/2011 |
| WO | 2015/122293 A1 | 8/2015 |

OTHER PUBLICATIONS

Nov. 22, 2016 International Search Report issued in Patent Application No. PCT/JP2016/075066.
Nov. 22, 2016 Written Opinion of the International Searching Authority issued in Patent Application No. PCT/JP2016/075066.

* cited by examiner

*Primary Examiner* — Kuo Liang Peng
(74) *Attorney, Agent, or Firm* — Oliff PLC

(57) ABSTRACT

A composition applied over a resist pattern includes a modified polysiloxane in which some of silanol groups of a polysiloxane containing a hydrolysis condensate of a hydrolyzable silane are capped, and a solvent, wherein a ratio of silanol groups to all Si atoms contained in the modified polysiloxane is 40 mol % or less. The modified polysiloxane ratio of the silanol groups is adjusted to a desired ratio by reacting the silanol groups of the polysiloxane with an alcohol. A method for producing a semiconductor device having the steps of forming a resist film on a substrate, forming a resist pattern by exposing and developing the resist film, applying the composition over the resist pattern during or after development, and reversing a pattern by removing the resist pattern by etching.

19 Claims, 3 Drawing Sheets

SILICON-CONTAINING COATING AGENT FOR REVERSING PLANARIZATION PATTERN

TECHNICAL FIELD

The present invention relates to a technique to reverse a pattern, in lithography process, by applying a coating liquid containing a polysiloxane over a resist pattern formed in the course of development of a resist or a resist pattern obtained after the development to load the pattern with the coating liquid, and then removing the resist by drying etching or the like.

BACKGROUND ART

A technique to process a substrate by forming a fine pattern on the substrate and performing etching following the pattern is widely used in the field of semiconductor production.

With development of lithography techniques, patterns are refined, a KrF excimer laser or an ArF excimer laser is used, and an exposure technique using an electron beam or EUV (extreme ultraviolet) is under examination.

As one of pattern formation techniques, a pattern reversal method is employed. Specifically, resist patterns are first formed on a semiconductor substrate, and the resist patterns are coated with a silicon-based coating liquid. Thus, the silicon-based coating liquid is filled between the resist patterns, and then the resultant is baked to form a coating film. Thereafter, an upper portion of the thus formed silicon-containing coating film is etched back by etching with a fluorine-based gas to expose a top portion of the resist pattern, subsequently the gas is changed to an oxygen-based etching gas to remove the resist pattern, and thus, a silicon-based pattern derived from the silicon-based coating film remains instead of the eliminated resist pattern, and the pattern is thus reversed.

When the silicon-based film with the reverse pattern thus formed is used as an etching mask to etch a lower layer or the substrate, the reverse pattern is transferred, and the pattern is formed on the substrate.

As a pattern forming method utilizing such a reverse pattern, there is an invention utilizing a material using a polysiloxane, which is obtained by co-hydrolysis of a silane having a hydrogen atom, a fluorine atom, a straight chain or branched chain alkyl group having a carbon atom number of 1 to 5, a cyano group, a cyanoalkyl group, an alkylcarbonyloxy group, an alkenyl group or an aryl group, and a tetraethoxysilane, and an ether-based solvent (see Patent Document 1).

Besides, there is an invention utilizing a material using a hydrogen siloxane (see Patent Document 2).

PRIOR ART DOCUMENTS

Patent Documents

Patent Document 1: Japanese Patent Application Publication No. 2011-118373
Patent Document 2: Japanese Patent Application Publication No. 2010-151923

SUMMARY OF THE INVENTION

Problem to be Solved by the Invention

As described above, in the pattern reversal method, resist patterns are coated with a silicon-based coating liquid to fill the silicon-based coating liquid between the resist patterns, the resultant is dried and baked to form a coating film in which a silicon-based material is filled, and thereafter, the coated silicon-based material is etched back with a fluorine-based gas to expose a surface of the resist patterns. Then, a gas species is changed to an oxygen-based gas for eliminating the resist pattern, and at a time of the etch back, a surface coated with the silicon-based material needs to be planarized at a prescribed level. If the surface is not planarized, a top portion of a line portion of the resist pattern and a filled space portion are not horizontal when the etch back is performed until the surface of the resist patterns is exposed, and therefore, a prescribed horizontal reverse pattern cannot be obtained after reversing the pattern. As a result, a lower layer etched afterward is unpreferably unevenly processed.

The present invention provides a coating agent for resist patterns that can be sufficiently filled between the resist patterns when applied over the resist patterns, and with which a line portion and a space portion are uniformly coated to obtain a plane coated surface.

Means for Solving the Problem

The present invention provides:

as a first aspect, a composition to be applied over a resist pattern, the composition comprising a modified polysiloxane in which some of silanol groups of a polysiloxane containing a hydrolysis condensate of a hydrolyzable silane are capped, and a solvent, in which a ratio of silanol groups to all Si atoms contained in the modified polysiloxane is 40 mol % or less;

as a second aspect, the composition according to the first aspect, comprising a modified polysiloxane in which the ratio of the silanol groups to all the Si atoms is 5 to 40 mol %;

as a third aspect, the composition according to the first aspect, comprising a modified polysiloxane in which the ratio of the silanol groups to all the Si atoms is 10 to 25 mol %;

as a fourth aspect, the composition according to any one of the first to third aspects, comprising a modified polysiloxane in which the ratio of the silanol groups is adjusted to a desired ratio by reacting the silanol groups of the polysiloxane with an alcohol;

as a fifth aspect, the composition according to the fourth aspect, in which the alcohol is a monohydric alcohol;

as a sixth aspect, the composition according to the fourth aspect, in which the alcohol is 4-methyl-2-pentanol, 1-methoxy-2-propanol, or 2-propanol;

as a seventh aspect, the composition according to any one of the first to sixth aspects, comprising a modified polysiloxane containing a dehydration reaction product of a polysiloxane, an alcohol, and an acid.

as an eighth aspect, the composition according to the seventh aspect, in which the modified polysiloxane is produced by reacting the polysiloxane containing the hydrolysis condensate of the hydrolyzable silane with the alcohol and the acid, and removing water generated through dehydration from a reaction system;

as a ninth aspect, the composition according to the seventh or eighth aspect, in which the acid is an acid having an acid dissociation constant of 4 to 5;

as a tenth aspect, the composition according to the seventh or eighth aspect, in which the acid is an acid having a boiling point of 70 to 160° C.;

as an eleventh aspect, the composition according to any one of the first to tenth aspects, in which the polysiloxane is a hydrolysis condensate of at least one hydrolyzable silane of the following formula (1):

$$R^1{}_a Si(R^2)_{4-a} \quad \text{Formula (1)}$$

wherein $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group or a cyano group and bonded to a silicon atom via a Si—C bond; $R^2$ is an alkoxy group, an acyloxy group, or a halogen group; and a is an integer of 0 to 3;

as a twelfth aspect, the composition according to the eleventh aspect, in which the polysiloxane is a hydrolysis condensate of a hydrolyzable silane (ii) of formula (1), wherein a is 1, or a co-hydrolysis condensate of a hydrolyzable silane (i) of formula (1), wherein a is 0, and the hydrolyzable silane (ii) of formula (1), wherein a is 1;

as a thirteenth aspect, the composition according to the twelfth aspect, in which the polysiloxane has a molar ratio of the hydrolyzable silane (i): the hydrolyzable silane (ii) of 0:100 to 50:50;

as a fourteenth aspect, the composition according to any one of the first to thirteenth aspects, to be applied over a resist pattern;

as a fifteenth aspect, the composition according to any one of the first to fourteenth aspects, to be applied over a line and space resist pattern;

as a sixteenth aspect, the composition according to any one of the first to fifteenth aspects, in which the resist pattern is a pattern formed by nanoimprint;

as a seventeenth aspect, a method for producing a semiconductor device, including: a step (1) of forming a resist film on a substrate, a step (2) of forming a resist pattern by exposing and subsequently developing the resist film, a step (3) of applying the composition according to any one of the first to sixteenth aspects over the resist pattern during or after development, and a step (4) of reversing a pattern by removing the resist pattern by etching;

as an eighteenth aspect, the production method according to the seventeenth aspect, including, before the step (1), a step (1-1) of forming a resist underlayer film on the substrate; and as a nineteenth aspect, the production method according to the seventeenth or eighteenth aspect, including, after the step (3), a step (3-1) of etching back a surface of a coated film consisting of a cured substance of the composition to expose a surface of the resist pattern.

Effects of the Invention

In a composition of the present invention, a ratio of silanol groups in a polysiloxane is set to fall in a specified range, and hence, a planarized coated surface can be obtained when a resist pattern formed on a semiconductor substrate is coated with the composition, and as a result, good pattern reversal is performed.

Specifically, in what is called a pattern reversal method, when resist patterns formed on a semiconductor substrate are coated with a silicon-based coating liquid containing the composition of the present invention, the silicon-based coating liquid is sufficiently filled between the resist patterns, and when the resultant is baked to form a coating film, a sufficiently planarized coated surface can be obtained. Therefore, when etch back is performed until a surface of the resist patterns is exposed, a top portion of a line portion of the resist patterns and a space portion filled with the silicon-based coating liquid are sufficiently horizontally arranged, and hence, a prescribed horizontal reverse pattern can be obtained after reversing the pattern, and in etching a lower layer afterward, the lower layer can be uniformly processed, resulting in obtaining good pattern reversal.

Besides, the present invention is applicable as a composition for planarizing a stepped substrate.

MODES FOR CARRYING OUT THE INVENTION

Figure 1:
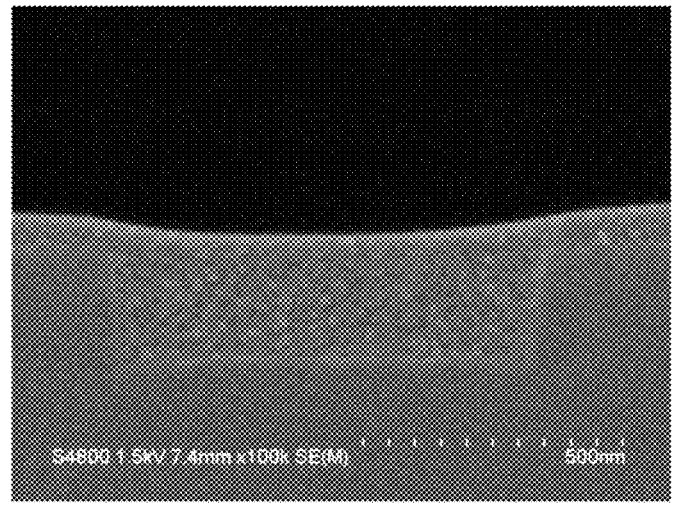
FIG. 1 is a cross-sectional view (at a magnification of 150000) of a film formed using a coating composition of Example 1 on a stepped substrate having a groove with a depth of 220 nm and a width of 800 nm.

The present invention is a composition containing a modified polysiloxane, which is obtained by hydrolyzing and condensing a hydrolyzable silane to obtain a polysiloxane, and by adjusting an amount of a silanol group present in the polysiloxane by capping the silanol group through reaction with an alcohol until a ratio of the silanol group to all Si atoms present in the polysiloxane becomes 40 mol % or less, or 5 to 40 mol %, or 10 to 25 mol %, and a planarized coated surface can be obtained by coating, with the composition, a resist pattern formed on a substrate.

Herein, planarization means that, in applying over a resist pattern, a film thickness difference in a coating substance applied between a portion where the resist pattern is present (a line portion) and a portion where the pattern is not present (a space portion) is small. In the present invention, the film thickness difference is 5 to 30 nm, or 10 to 30 nm.

Specifically, the present invention is a composition to be applied over a resist pattern, containing a modified polysiloxane, which is obtained by capping some of silanol groups of a polysiloxane containing a hydrolysis condensate of a hydrolyzable silane, and a solvent, in which a ratio of the silanol groups to all Si atoms contained in the modified polysiloxane is 40 mol % or less.

The ratio of the silanol groups to all the Si atoms can be 5 to 40 mol %, or 10 to 25 mol %.

In the composition, the hydrolyzable silane, a hydrolysate of the hydrolyzable silane, or the hydrolysis condensate of the hydrolyzable silane (the polysiloxane) is dissolved in the solvent, and a solid content is 0.5 to 20.0% by mass, or 1.0 to 10.0% by mass. A solid content refers to a ratio of a remaining portion obtained by removing the solvent from the composition.

A ratio of the hydrolyzable silane, the hydrolysate of the hydrolyzable silane, and the hydrolysis condensate of the hydrolyzable silane (the polysiloxane) in the solid content is 50 to 100% by mass, or 80 to 100% by mass.

A concentration of the hydrolyzable silane, the hydrolysate of the hydrolyzable silane, and the hydrolysis condensate of the hydrolyzable silane (the polysiloxane) in the composition is 0.5 to 20.0% by mass.

The present invention is a composition for coating to be used after exposure of a resist, and hence, the resist is exposed through a mask, and the composition is filled during or after development of the resist.

The hydrolyzable silane, the hydrolysate of the hydrolyzable silane, and the hydrolysis condensate of the hydrolyzable silane contain a resin component different from the resist.

Therefore, in a dry etching step subsequently performed a gas species is selected to selectively remove the resist by dry etching, and to fill the hydrolysis condensate (polysiloxane) for forming a new pattern.

In the present invention, a modified polysiloxane in which a ratio of silanol groups is adjusted to a desired ratio by reacting silanol groups contained in the polysiloxane with an alcohol can be used. In other words, in the modified polysiloxane of the present invention, some of silanol groups contained therein are capped with an alcohol, and a monohydric alcohol can be used as the alcohol. The monohydric alcohol is an alcohol having a carbon atom number of 3 to 10, and a branched chain alcohol is more preferably used than a straight chain alcohol.

For example, 4-methyl-2-pentanol, 1-methoxy-2-propanol, 2-propanol or the like can be used.

When the polysiloxane is brought into contact with the alcohol serving as a capping agent and reacted at a temperature of 110 to 160° C., for example, at 150° C. for 0.1 to 48 hours, for example, for 24 hours, the modified polysiloxane in which silanol groups are capped can be obtained. At this time, the alcohol used as the capping agent can be used as a solvent in the composition to be applied over a resist pattern.

For the polysiloxane (the hydrolysis condensate), a hydrolyzable silane or a hydrolysate of the hydrolyzable silane can be used in the form of a mixture. Accordingly, in obtaining the hydrolysis condensate, if a partial hydrolysate in which the hydrolysis has not been completed, or a silane compound is mixedly present in the hydrolysis condensate, such a mixture can be used. This condensate is a polymer having a polysiloxane structure.

The modified polysiloxane may be a dehydration reaction product of a polysiloxane, which is obtained by hydrolyzing and condensing a hydrolyzable silane, an alcohol and an acid.

In this case, the modified polysiloxane may be produced by reacting, with an alcohol and an acid, a polysiloxane obtained by hydrolyzing and condensing a hydrolyzable silane, and removing water generated through dehydration from a reaction system. One synthesized using an apparatus equipped with such a mechanism can be used.

As the acid, an organic acid having an acid dissociation constant (pka) of −1 to 5, and preferably 4 to 5 can be used. Examples of such an acid include trifluoroacetic acid, maleic acid, benzoic acid, isobutyric acid, and acetic acid, among which benzoic acid, isobutyric acid, and acetic acid are preferred.

Besides, the acid is preferably an acid having a boiling point of 70 to 160° C. Examples of such an acid include trifluoroacetic acid, isobutyric acid, and acetic acid.

The acid preferably has a physical property of either an acid dissociation constant (pka) of 4 to 5, or a boiling point of 70 to 160° C. In other words, one having weak acidity, or one having strong acidity but a low boiling point can be used.

As the acid, an acid having either of the properties of the acid dissociation constant and the boiling point can be used, and acetic acid having both the properties can be preferably used.

As the polysiloxane not modified yet, that is, a raw material used in the present invention, a hydrolysis condensate obtained by hydrolyzing and condensing at least one hydrolyzable silane of formula (1) can be used.

In formula (1), $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group or a cyano group and bonded to a silicon atom via a Si—C bond; $R^2$ is an alkoxy group, an acyloxy group, or a halogen group; and a is an integer of 0 to 3.

As the polysiloxane, a hydrolysis condensate of a hydrolyzable silane (ii) of formula (1) in which a is 1, or a co-hydrolysis condensate of a hydrolyzable silane (i) of formula (1) in which a is 0 and the hydrolyzable silane (ii) of formula (1) in which a is 1 can be used.

In the polysiloxane, a molar ratio of the hydrolyzable silane (i): the hydrolyzable silane (ii) is in a range of 0:100 to 50:50, or 10:90 to 50:50.

In formula (1), the alkyl group is a straight chain or branched alkyl group having a carbon atom number of 1 to 10, and examples include: methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Alternatively, a cyclic alkyl group can be used, and examples of a cyclic alkyl group having a carbon atom of 1 to 10 include: cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Besides, an example of the halogenated alkyl group includes an organic group obtained by substituting any of the aforementioned groups with a halogen atom such as fluorine, chlorine, bromine or iodine.

An example of the aryl group includes an aryl group having a carbon atom number of 6 to 20, or a halogenated aryl group substituted with a halogen atom may be used, and examples include: phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Besides, an example of the alkoxyaryl group includes an organic group in which the aryl group has an alkoxy group mentioned below as a substituent.

The alkenyl group can be an alkenyl group having a carbon atom number of 2 to 10, and examples include: ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butyl ethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Another example includes an organic group obtained by substituting any of the aforementioned groups with a halogen atom such as fluorine, chlorine, bromine or iodine.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloyl methyl, acryloyl ethyl, and acryloyl propyl.

Examples of the organic group having a methacryloyl group include methacryloyl methyl, methacryloyl ethyl, and methacryloyl propyl.

Examples of the organic group having a mercapto group include ethylmercapto, butylmercapto, hexylmercapto, and octylmercapto.

Examples of the organic group having a cyano group include cyanoethyl and cyanopropyl.

The alkoxy group of $R^2$ in formula (1) can be an alkoxy group having a straight chain, branched or cyclic alkyl portion having a carbon atom number of 1 to 20, and examples include: methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group, and examples of a cyclic alkoxy group include: cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The acyloxy group of $R^2$ in formula (1) can be an acyloxy group having a carbon atom number of 1 to 20, and examples include: methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen group of $R^2$ in formula (1) include fluorine, chlorine, bromine, and iodine.

Examples of the hydrolyzable silane of formula (1) used as a raw material of the polysiloxane used in the present invention include tetramethoxysilane, tetraethoxysilane, methyltrimethoxysilane, and methyltriethoxysilane.

The hydrolysis condensate (the polysiloxane) of the hydrolyzable silane of formula (1) is obtained as a condensate having a weight average molecular weight of 1000 to 1000000, or 1000 to 100000. The molecular weight refers to a molecular weight obtained by GPC analysis in terms of polystyrene.

The GPC can be performed under measurement conditions of, for example, a GPC apparatus (trade name: HLC-8220 GPC, manufactured by Tosoh Corporation), GPC columns (trade name: Shodex KF803L, KF802, KF801, manufactured by Showa Denko K.K.), a column temperature of 40° C., an eluent (an elution solvent) of tetrahydrofuran, a flow rate (flow speed) of 1.0 ml/min, and a standard sample of polystyrene (manufactured by Showa Denko K.K.).

For hydrolysis of an alkoxysilyl group, an acyloxysilyl group, or a halogenated silyl group, 0.5 to 100 mol, and preferably 1 to 10 mol of water is used per mol of the hydrolytic group.

Besides, a hydrolysis catalyst can be used for the hydrolysis, but the hydrolysis can be performed without using a hydrolysis catalyst. If a hydrolysis catalyst is used, 0.001 to 10 mol, and preferably 0.001 to 1 mol of the hydrolysis catalyst can be used per mol of the hydrolytic group.

A reaction temperature in performing the hydrolysis and the condensation is usually 20 to 110° C.

The hydrolysis may be performed as full hydrolysis or partial hydrolysis. In other words, a hydrolysate or a monomer may remain in the hydrolysis condensate.

A catalyst may be used in the hydrolysis and the condensation.

Examples of the hydrolysis catalyst include a metal chelate compound, an organic acid, an inorganic acid, an organic base, and an inorganic base.

Examples of the metal chelate compound used as the hydrolysis catalyst include: a titanium chelate compound such as triethoxy mono(acetylacetonate)titanium, tri-n-propoxy mono(acetylacetonate)titanium, tri-i-propoxy mono(acetylacetonate)titanium, tri-n-butoxy mono(acetylacetonate)titanium, tri-sec-butoxy mono(acetylacetonate)titanium, tri-t-butoxy mono(acetylacetonate)titanium, diethoxy bis(acetylacetonate)titanium, di-n-propoxy bis(acetylacetonate)titanium, di-i-propoxy bis(acetylacetonate)titanium, di-n-butoxy bis(acetylacetonate)titanium, di-sec-butoxy bis(acetylacetonate)titanium, di-t-butoxy bis(acetylacetonate)titanium, monoethoxy tris(acetylacetonate)titanium, mono-n-propoxy tris(acetylacetonate)titanium, mono-i-propoxy tris(acetylacetonate)titanium, mono-n-butoxy tris(acetylacetonate)titanium, mono-sec-butoxy tris(acetylacetonate)titanium, mono-t-butoxy tris(acetylacetonate)titanium, tetrakis(acetylacetonate)titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy bis(ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate)titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, or tris(acetylacetonate)mono(ethylacetoacetate)titanium; a zirconium chelate compound such as triethoxy mono(acetylacetonate)zirconium, tri-n-propoxy mono(acetylacetonate)zirconium, tri-i-propoxy mono(acetylacetonate)zirconium, tri-n-butoxy mono(acetylacetonate)zirconium, tri-sec-butoxy mono(acetylacetonate)zirconium, tri-t-butoxy mono(acetylacetonate)zirconium, diethoxy bis(acetylacetonate)zirconium, di-n-propoxy bis(acetylacetonate)zirconium, di-i-propoxy bis(acetylacetonate)zirconium, di-n-butoxy bis(acetylacetonate)zirconium, di-sec-butoxy bis(acetylacetonate)zirconium, di-t-butoxy bis(acetylacetonate)zirconium, monoethoxy tris(acetylacetonate)zirconium, mono-n-propoxy tris(acetylacetonate)zirconium, mono-i-propoxy tris(acetylacetonate)zirconium, mono-n-butoxy tris(acetylacetonate)zirconium, mono-sec-butoxy tris(acetylacetonate)zirconium, mono-t-butoxy tris(acetylacetonate)zirconium, tetrakis(acetylacetonate)zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono(ethylacetoacetate)zirconium, tri-sec-butoxy mono(ethylacetoacetate)zirconium, tri-t-butoxy mono(ethylacetoacetate)zirconium, diethoxy bis(ethylacetoacetate)zirconium, di-n-propoxy bis(ethylacetoacetate)zirconium, di-i-propoxy bis(ethylacetoacetate)zirconium, di-n-butoxy bis(ethylacetoacetate)zirconium, di-sec-butoxy bis(ethylacetoacetate)zirconium, di-t-butoxy bis(ethylacetoacetate)zirconium, monoethoxy tris(ethylacetoacetate)zirconium, mono-n-propoxy tris(ethylacetoacetate)zirconium, mono-i-propoxy tris(ethylacetoacetate)zirconium, mono-n-butoxy tris(ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, or tris(acetylacetonate)mono(ethylacetoacetate)

zirconium; and an aluminum chelate compound such as tris(acetylacetonate)aluminum, or tris(ethylacetoacetate) aluminum.

Examples of the organic acid used as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid used as the hydrolysis catalyst include hydrochloric acid, nitric acid, sulfuric acid, fluoric acid, and phosphoric acid.

Examples of the organic base used as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, and tetraethylammonium hydroxide. Examples of the inorganic base include ammonia, sodium hydroxide, potassium hydroxide, barium hydroxide and calcium hydroxide.

Examples of an organic solvent to be used in the hydrolysis include an aliphatic hydrocarbon-based solvent such as n-pentane, i-pentane, n-hexane, i-hexane, n-heptane, i-heptane, 2,2,4-trimethylpentane, n-octane, i-octane, cyclohexane or methylcyclohexane; an aromatic hydrocarbon-based solvent such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene or trimethylbenzene; a monoalcohol-based solvent such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol or cresol; a polyhydric alcohol-based solvent such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol or glycerin; a ketone-based solvent such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonylacetone, diacetone alcohol, acetophenone or fenchone; an ether-based solvent such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran or 2-methyltetrahydrofuran; an ester-based solvent such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate or diethyl phthalate; a nitrogen-containing solvent such as N-methylformamide, N,N-dimethylformamide, N,N-diethylformamide, acetamide, N-methylacetamide, N,N-dimethylacetamide, N-methylpropionamide or N-methylpyrrolidone; and a sulfur-containing solvent such as dimethyl sulfide, diethyl sulfide, thiophene, tetrahydrothiophene, dimethyl sulfoxide, sulfolane or 1,3-propane sultone. One of or a combination of two or more of these solvents can be used.

The hydrolyzable silane is hydrolyzed and condensed in the solvent by using the catalyst, and the hydrolysis condensate (polymer) thus obtained is subjected to distillation under reduced pressure or the like so that an alcohol of a byproduct and the used hydrolysis catalyst and water can be simultaneously removed. Besides, the acid or the base catalyst used in the hydrolysis can be removed by neutralization or ion exchange.

To the composition of the present invention, a surfactant can be added, and examples include a nonionic surfactant, an anionic surfactant, a cationic surfactant, a silicon-based surfactant and a UV curable type surfactant.

One of these surfactants may be singly used, or a combination of two or more of these can be used. If the surfactant is used, a ratio of the surfactant is 0.0001 to 5 parts by mass, 0.001 to 5 parts by mass, or 0.01 to 5 parts by mass with respect to 100 parts by mass of the condensate (polyorganosiloxane).

As a solvent used in the composition of the present invention to be applied over a resist pattern, any of alcohol solvents used in the capping described above can be used.

The present invention also relates to a method for producing a semiconductor device, including a step (1) of forming a resist film by applying a resist on a substrate, a step (2) of forming a resist pattern by exposing and subsequently developing the resist film, a step (3) of applying the composition of the present invention over the resist pattern during or after the development, and a step (4) of reversing a pattern by removing the resist pattern by etching.

As described above, the composition of the present invention is a composition to be applied over a resist pattern, and more specifically, a composition to be applied over a line and space resist pattern. The composition is applied over a resist pattern having a layout including sparse and dense pattern areas (line portions).

Besides, a pattern formed by nanoimprint can be used as the resist pattern.

The photoresist used in the step (1) is not especially limited as long as the resist is photosensitive to light used for the exposure. Either of a negative photoresist and a positive photoresist can be used. Examples include a positive photoresist containing a novolac resin and 1,2-naphthoquinone diazide sulfonate, a chemically amplified photoresist containing a binder having a group decomposed by an acid to increase an alkali dissolution rate and a photoacid generator, a chemically amplified photoresist containing a low molecular weight compound decomposed by an acid to increase an alkali dissolution rate of the photoresist, an alkali-soluble binder and a photoacid generator, and a chemically amplified photoresist containing a binder having a group decomposed by an acid to increase an alkali dissolution rate, a low molecular weight compound decomposed by an acid to increase the alkali dissolution rate of the photoresist and a photoacid generator. Examples include one available under trade name APEX-E from Shipley, one available under trade name PAR710 from Sumitomo Chemical Co., Ltd., and one available under trade name SEPR430 from Shin-Etsu Chemical Co., Ltd. Other examples include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Besides, as an electron beam resist, either of a negative resist and a positive resist can be used. Examples include a chemically amplified resist containing a photoacid generator and a binder having a group decomposed by an acid to change an alkali dissolution rate, a chemically amplified resist containing an alkali-soluble binder, photoacid generator and a low molecular weight compound decomposed by an acid to change an alkali dissolution rate of the resist, a chemically amplified resist containing a photoacid generator, a binder having a group decomposed by an acid to change an alkali dissolution rate, and a low molecular weight compound decomposed by an acid to change the alkali dissolution rate of the resist, a non-chemically amplified resist containing a binder having a group decomposed by an electron beam to change an alkali dissolution rate, and a non-chemically amplified resist containing a binder having a portion cut by an electron beam to change an alkali dissolution rate. Also when such an electron beam resist is used, a resist pattern can be formed in the same manner as when a photoresist is used with an electron beam used as an irradiation source.

After applying a resist solution, baking is performed at a temperature of 70 to 150° C. for 0.5 to 5 minutes, and a resist film having a thickness of 10 to 1000 nm is obtained. The resist solution, a developer or a coating material described later can be coated by a spin coating method, a dipping method, a spraying method or the like, and the spin coating method is particularly preferably employed. Exposure of the resist is performed through a prescribed mask. For the exposure, a KrF excimer laser (wavelength of 248 nm), an ArF excimer laser (wavelength of 193 nm), EUV light (wavelength of 13.5 nm), an electron beam or the like can be used. After the exposure, post exposure bake (PEB) can be performed if necessary. The post exposure bake is appropriately selectively performed at a heating temperature of 70° C. to 150° C. for a heating time of 0.3 to 10 minutes.

The method can include, before the step (1), a step (1-1) of forming a resist underlayer film on the substrate. The resist underlayer film has an anti-reflection or organic-based hard mask function.

Specifically, the formation of the resist of the step (1) can be performed as the step (1-1) of forming the resist on the resist underlayer film having been formed on the semiconductor substrate.

Besides, in the step (1-1), the resist underlayer film is formed on the semiconductor substrate, a hard mask of silicon is formed thereon, and the resist can be formed thereon.

The resist underlayer film used in the step (1-1) prevents diffuse reflection otherwise occurring in the exposure of the resist formed thereon, and besides, is used for purposes of improving adhesiveness to the resist, and for example, an acrylic-based resin or a novolac-based resin can be used. The resist underlayer film can be formed as a coating film having a thickness of 1 to 1000 nm on the semiconductor substrate.

Besides, the resist underlayer film used in the step (1-1) is a hard mask using an organic resin, and a material having a high carbon content and a low hydrogen content is used. Examples include a polyvinyl naphthalene-based resin, a carbazole novolac resin, a phenol novolac resin and a naphthol novolac resin. Such a resin can form a coating film having a thickness of 5 to 1000 nm on the semiconductor substrate.

Besides, as a silicon hard mask used in the step (1-1), a polysiloxane obtained by hydrolyzing a hydrolyzable silane can be used. Examples include a polysiloxane obtained by hydrolyzing tetraethoxysilane, methyltrimethoxysilane or phenyltriethoxysilane. Such a resin can form a coating film having a thickness of 5 to 200 nm on the resist underlayer film.

In the step (2), the exposure is performed through a prescribed mask. For the exposure, a KrF excimer laser (wavelength of 248 nm), an ArF excimer laser (wavelength of 193 nm), EUV (wavelength of 13.5 nm) or the like can be used. After the exposure, the post exposure bake can be performed if necessary. The post exposure bake can be appropriately performed under conditions selected from a heating temperature of 70° C. to 150° C. and a heating time of 0.3 to 10 minutes.

Subsequently, the development is performed using a developer. Thus, if, for example, a positive photoresist is used, an exposed portion of the photoresist is removed, resulting in forming a pattern of the photoresist.

Examples of the developer include alkaline aqueous solutions such as an aqueous solution of an alkali metal hydroxide such as potassium hydroxide or sodium hydroxide, an aqueous solution of a quaternary ammonium hydroxide such as tetramethylammonium hydroxide, tetraethylammonium hydroxide or choline, and an amine aqueous solution of ethanolamine, propylamine, ethylenediamine or the like. Besides, a surfactant or the like can be added to such a developer. Development conditions can be appropriately selected from a temperature of 5 to 50° C. and a time of 10 to 600 seconds.

Alternatively, an organic solvent can be used as the developer in the present invention. The development is performed using a developer (a solvent) after the exposure. Thus, if, for example, a positive photoresist is used, an unexposed portion of the photoresist is removed, resulting in forming a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

To such a developer, a surfactant or the like can be further added. Conditions for the development are appropriately selected from a temperature of 5 to 50° C. and a time of 10 to 600 seconds.

In the step (3), the coating composition of the present invention is applied over the resist during or after the development. In the step (3), the coating composition can be formed by heating. The heating can be performed at a baking temperature of 50 to 180° C. for 0.5 to 5 minutes.

Besides, in the present invention, a step (3-1) of exposing a resist pattern surface by etching back a surface portion of a coating film of a cured substance of the composition of the present invention can be performed after the step (3). In this manner, the resist pattern surface accords with a surface of the coating composition in the subsequent step (4), and owing to a difference in a gas etching rate between the resist pattern and the coating composition, merely a resist component is removed and a component of the coating composition remains, resulting in reversing the pattern. The etch back is performed using a gas capable of removing the coating composition (such as a fluorine-based gas) for exposing the resist pattern.

In the step (4), the resist pattern is removed by etching to reverse the pattern. In the step (4), dry etching is performed using a gas of tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride or the like. The dry etching is performed particularly preferably using an oxygen-based gas.

In this manner, the initial resist pattern is removed, and a reverse pattern of a reverse pattern forming polymer (the modified polysiloxane of the present invention) contained in the coating composition is formed.

In the present invention, resist patterns are formed on a semiconductor substrate, and the resist patterns are coated with a silicon-based coating liquid containing the composition of the present invention as described above. Thus, the silicon-based coating liquid is filled between the resist patterns, and the resultant is baked to form a coating film. Thereafter, an upper portion of the thus obtained silicon-containing coating film is etched back by etching using a fluorine-based gas to expose a top portion of the resist pattern, and then, the gas is changed to remove the resist pattern by using an oxygen-based etching gas, and in this manner, the pattern is reversed by eliminating the resist pattern and allowing a silicon-based pattern derived from the silicon-based coating film to remain.

If a coated surface of the silicon-based material is not planarized at a prescribed level in the etch back, a top portion of a line portion and a filled space portion of the resist patterns are not horizontally arranged when the etch back is performed until the surface of the resist patterns is exposed, and hence, a prescribed horizontal reverse pattern cannot be obtained after reversing the pattern. This unpreferably leads to uneven processing of a lower layer in etching the lower layer afterward.

In the composition of the present invention, however, since the ratio of silanol groups in the polysiloxane is set to fall in the specified range, a planarized coated surface can be obtained when a resist pattern formed on a semiconductor substrate is coated with the composition, and hence, good pattern reversal is performed.

EXAMPLES

Synthesis Example 1

A 500 ml flask was charged with 53.9 g (50 mol %) of tetraethoxysilane, 46.1 g (50 mol %) of methyltriethoxysilane, and 100 g of acetone, and under stirring of a mixed solution thus obtained in the flask with a magnetic stirrer, 32.6 g of 0.01 mol/L hydrochloric acid was added to the mixed solution in a dropwise manner. After the dropwise addition, the flask was transferred to an oil bath adjusted to 85° C., and a reaction was performed for 4 hours under heating reflux. Thereafter, the resultant reaction solution was cooled to room temperature, 100 g of 4-methyl-2-pentanol was added to the reaction solution, acetone, water, hydrochloric acid and a reaction byproduct of ethanol were distilled off under reduced pressure from the reaction solution, and the resultant was concentrated to obtain a 4-methyl-2-pentanol solution of a co-hydrolysis condensate (a polysiloxane). A solid content was adjusted to 13% by mass in terms of a solid remnant at 140° C.

To 15 g of the thus prepared polymer solution, 20 mg of acetic acid was added. The resultant flask was transferred to an oil bath adjusted to 150° C., and a reaction was performed under heating reflux for 24 hours. A weight average molecular weight Mw obtained by the GPC in terms of polystyrene was 3700. The thus obtained polysiloxane was a polysiloxane in which some of silanol groups are capped by 4-methyl-2-pentanol.

Synthesis Example 2

A 500 ml flask was charged with 22.2 g (30 mol %) of tetraethoxysilane, 44.4 g (70 mol %) of methyltriethoxysilane, and 100 g of acetone, and under stirring of a mixed solution thus obtained in the flask with a magnetic stirrer, 21.2 g of 0.01 mol/L hydrochloric acid was added to the mixed solution in a dropwise manner. After the dropwise addition, the flask was transferred to an oil bath adjusted to 85° C., and a reaction was performed for 4 hours under heating reflux. Thereafter, the resultant reaction solution was cooled to room temperature, 100 g of 4-methyl-2-pentanol was added to the reaction solution, acetone, water, hydrochloric acid and a reaction byproduct of ethanol were distilled off under reduced pressure from the reaction solution, and the resultant was concentrated to obtain a 4-methyl-2-pentanol solution of a co-hydrolysis condensate (a polysiloxane). A solid content was adjusted to 13% by mass in terms of a solid remnant at 140° C.

To 15 g of the thus prepared polymer solution, 20 mg of acetic acid was added. The resultant flask was transferred to an oil bath adjusted to 150° C., and a reaction was performed under heating reflux for 48 hours. A weight average molecular weight Mw obtained by the GPC in terms of polystyrene was 5300. The thus obtained polysiloxane was a polysiloxane in which some of silanol groups are capped by 4-methyl-2-pentanol.

Synthesis Example 3

A 500 ml flask was charged with 22.2 g (30 mol %) of tetraethoxysilane, 44.4 g (70 mol %) of methyltriethoxysilane, and 100 g of acetone, and under stirring of a mixed solution thus obtained in the flask with a magnetic stirrer, 21.2 g of 0.01 mol/L hydrochloric acid was added to the mixed solution in a dropwise manner. After the dropwise addition, the flask was transferred to an oil bath adjusted to 85° C., and a reaction was performed for 4 hours under heating reflux. Thereafter, the resultant reaction solution was cooled to room temperature, 100 g of 2-propanol was added to the reaction solution, acetone, water, hydrochloric acid and a reaction byproduct of ethanol were distilled off under reduced pressure from the reaction solution, and the resultant was concentrated to obtain a 2-propanol solution of a co-hydrolysis condensate (a polysiloxane). A solid content was adjusted to 13% by mass in terms of a solid remnant at 140° C.

To 15 g of the thus prepared polymer solution, 20 mg of acetic acid was added. The resultant flask was transferred to an oil bath adjusted to 150° C., and a reaction was performed under heating reflux for 12 hours. A weight average molecular weight Mw obtained by the GPC in terms of polystyrene was 6000. The thus obtained polysiloxane was a polysiloxane in which some of silanol groups are capped by 2-propanol.

Synthesis Example 4

A 500 ml flask was charged with 22.2 g (30 mol %) of tetraethoxysilane, 44.4 g (70 mol %) of methyltriethoxysilane, and 100 g of acetone, and under stirring of a mixed solution thus obtained in the flask with a magnetic stirrer, 21.2 g of 0.01 mol/L hydrochloric acid was added to the mixed solution in a dropwise manner. After the dropwise addition, the flask was transferred to an oil bath adjusted to 85° C., and a reaction was performed for 4 hours under heating reflux. Thereafter, the resultant reaction solution was cooled to room temperature, 100 g of 1-methoxy-2-propanol was added to the reaction solution, acetone, water, hydrochloric acid and a reaction byproduct of ethanol were distilled off under reduced pressure from the reaction solution, and the resultant was concentrated to obtain a 1-methoxy-2-propanol solution of a co-hydrolysis condensate (a polysiloxane). A solid content was adjusted to 13% by mass in terms of a solid remnant at 140° C.

To 15 g of the thus prepared polymer solution, 20 mg of acetic acid was added. The resultant flask was transferred to an oil bath adjusted to 150° C., and a reaction was performed under heating reflux for 12 hours. A weight average molecular weight Mw obtained by the GPC in terms of polystyrene was 4000. The thus obtained polysiloxane was a polysiloxane in which some of silanol groups are capped by 1-methoxy-2-propanol.

Comparative Synthesis Example 1

A 500 ml flask was charged with 53.9 g (50 mol %) of tetraethoxysilane, 46.1 g (50 mol %) of methyltriethoxysilane, and 100 g of acetone, and under stirring of a mixed solution thus obtained in the flask with a magnetic stirrer, 32.6 g of 0.01 mol/L hydrochloric acid was added to the mixed solution in a dropwise manner. After the dropwise addition, the flask was transferred to an oil bath adjusted to 85° C., and a reaction was performed for 4 hours under heating reflux. Thereafter, the resultant reaction solution was cooled to room temperature, 100 g of 4-methyl-2-pentanol was added to the reaction solution, acetone, water, hydrochloric acid and a reaction byproduct of ethanol were distilled off under reduced pressure from the reaction solution, and the resultant was concentrated to obtain a 4-methyl-2-pentanol solution of a co-hydrolysis condensate (a polysiloxane). A solid content was adjusted to 13% by mass in terms of a solid remnant at 140° C. A weight average molecular weight Mw obtained by the GPC in terms of polystyrene was 1400. The thus obtained polysiloxane was a polysiloxane in which some of silanol groups are capped by 4-methyl-2-pentanol.

(Measurement of Capping Ratio)

A silanol group ratio in each polymer, and a capping ratio of 4-methyl-2-pentanol, 1-methoxy-2-propanol and 2-propanol were calculated based on $^1$HNMR. Measurement was performed using JNM-ECA500 (manufactured by JEOL Ltd.). First, an integral ratio of a chemical shift value (0.0 to 0.3 ppm) of methyl proton in triethoxymethylsilane was obtained to be used as a reference. Chemical shift values of methine proton in 4-methyl-2-pentanol, 1-methoxy-2-propanol and 2-propanol are detected in the vicinity of 3.8 ppm, but if a bond to a silicon atom is formed through a dehydration condensation reaction with a silanol group, namely, if a capping reaction occurs in a silanol group, the chemical shift value of methine proton moves to the vicinity of 4.2 ppm. An integral ratio of methine proton having moved to the vicinity of 4.2 ppm was measured to be compared with the integral ratio of methyl proton in triethoxymethylsilane precedently measured, and thus, the capping ratio of 4-methyl-2-pentanol, 1-methoxy-2-propanol and 2-propanol per silicon atom in each polymer was calculated.

[Preparation of Coating Liquid]

Each of the polymer solutions obtained in Synthesis Examples 1 to Synthesis Example 4 and Comparative Synthesis Example 1 was diluted with 1-methoxy-2-propanol, 2-propanol or 1-methoxy-2-propanol to obtain a coating liquid. A content of each polymer shown in Table 1 refers not to a content of the polymer solution but to a content of a solid obtained by excluding the solvent from the polymer solution. A content of each component is shown in parts by mass. In Table 1, 4-methyl-2-pentanol, 2-propanol and 1-methoxy-2-propanol are respectively abbreviated as MIBC, IPA and PGME.

TABLE 1

|  | Polymer | Solvent | Silanol group/capping ratio (Si = 1.00) |
|---|---|---|---|
| Preparation Example 1 | Synthesis Example 1 | MIBC | SiOH/MIBC capping |
| Content | 4 | 100 | 0.25/0.27 |
| Preparation Example 2 | Synthesis Example 2 | MIBC | SiOH/MIBC capping |
| Content | 4 | 100 | 0.24/0.20 |
| Preparation Example 3 | Synthesis Example 3 | IPA | SiOH/IPA capping |
| Content | 4 | 100 | 0.25/0.19 |
| Preparation Example 4 | Synthesis Example 4 | PGME | SiOH/PGME capping |
| Content | 4 | 100 | 0.22/0.25 |
| Preparation Example 5 | Comparative Synthesis Example 1 | MIBC | SiOH/MIBC capping |
| Content | 4 | 100 | 0.45/0.04 |

Evaluation results obtained by using a coating liquid (a coating composition) of the present invention will now be described.

[Planarizing Property of Coating Liquid]
(Evaluation of Planarizing Property on Si Substrate)

Each polysiloxane composition for coating of Examples 1 to 4 and Comparative Example 1 was evaluated for a planarizing property as follows. Evaluation results are shown in Table 1.

On a stepped substrate having a groove with a depth of 220 nm and a width of 800 nm, each polysiloxane composition for coating (coating composition) of Examples 1 to 4 and Comparative Example 1 was coated by using a spin coater under conditions of a rotational speed of 1500 rpm for 60 seconds, and the resultant was dried on a hot plate at 110° C. for 1 minute, so as to form a film of the polysiloxane composition for coating. A thickness of the film of the polysiloxane composition for coating was set to 120 nm. Subsequently, the film of the polysiloxane composition for coating thus obtained was evaluated for a planarizing property by observing a cross-section thereof by cross-sectional SEM. A groove pattern with a depth of 220 nm and a width of 800 nm was observed, a thickness of the film was measured in a portion having the smallest thickness from a groove bottom and a portion having the largest thickness, a thickness difference was calculated, and a smaller thickness difference was evaluated as a better planarizing property. Besides, SEM photographs used in the evaluation are illustrated in FIGS. 1 to 5.

TABLE 2

Figure 2:
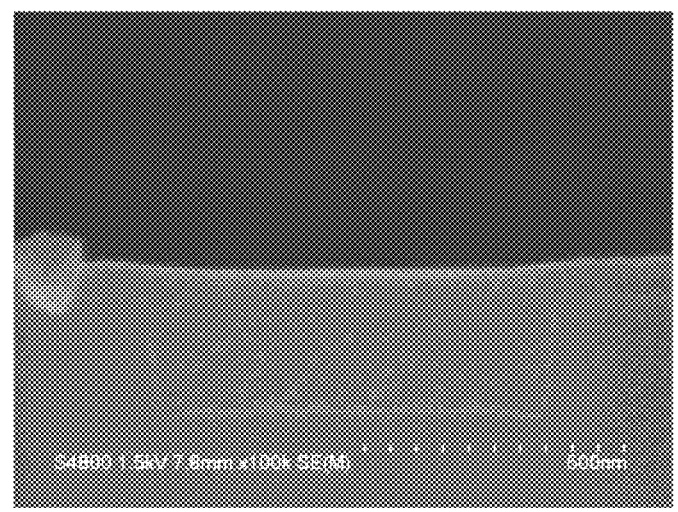
FIG. 2 is a cross-sectional view (at a magnification of 150000) of a film formed using a coating composition of Example 2 on a stepped substrate having a groove with a depth of 220 nm and a width of 800 nm.
Figure 3:
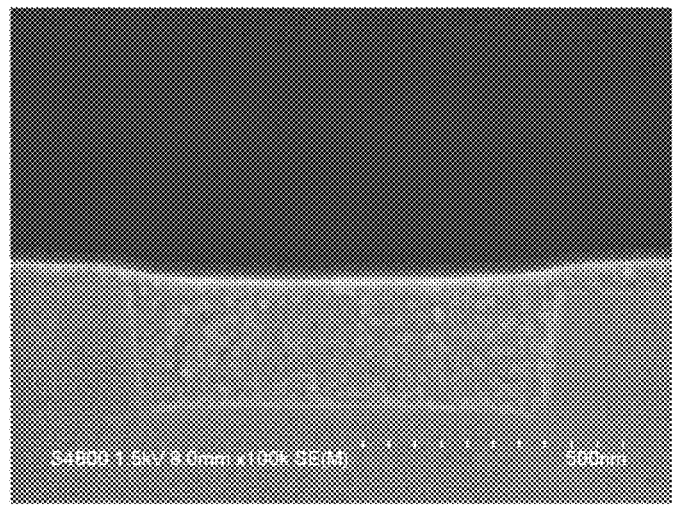
FIG. 3 is a cross-sectional view (at a magnification of 150000) of a film formed using a coating composition of Example 3 on a stepped substrate having a groove with a depth of 220 nm and a width of 800 nm.
Figure 4:
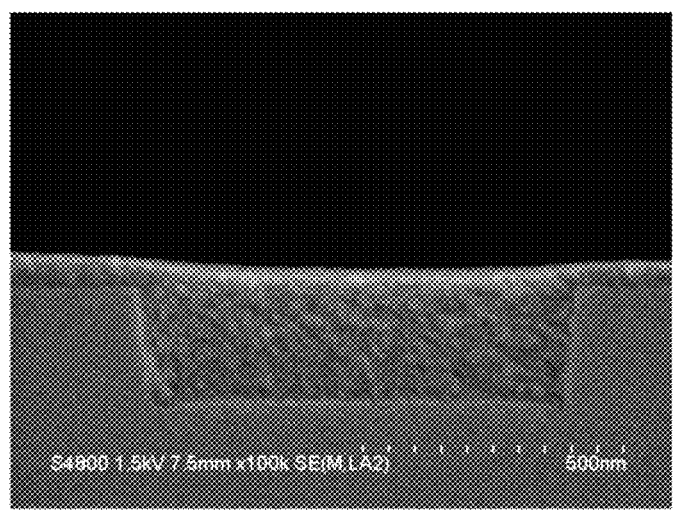
FIG. 4 is a cross-sectional view (at a magnification of 150000) of a film formed using a coating composition of Example 4 on a stepped substrate having a groove with a depth of 220 nm and a width of 800 nm.
Figure 5:
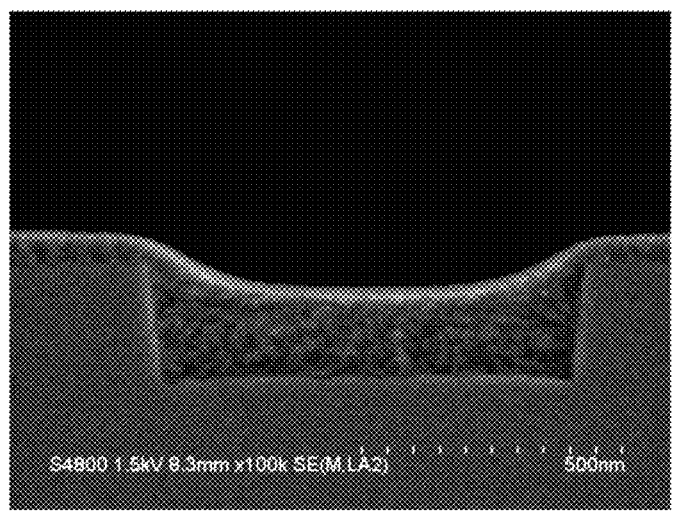
FIG. 5 is a cross-sectional view (at a magnification of 150000) of a film formed using a coating composition of Comparative Example 1 on a stepped substrate having a groove with a depth of 220 nm and a width of 800 nm.

| Example | Coating composition | Thickness difference | SEM photograph |
|---|---|---|---|
| Example 1 | Preparation Example 1 | 54 nm | FIG. 1 |
| Example 2 | Preparation Example 2 | 26 nm | FIG. 2 |
| Example 3 | Preparation Example 3 | 38 nm | FIG. 3 |
| Example 4 | Preparation Example 4 | 30 nm | FIG. 4 |
| Comparative Example 1 | Preparation Example 5 | 104 nm | FIG. 5 |

[Evaluation of Planarizing Property on Nanoimprint Substrate]

Next, a planarizing property on a substrate having been patterned by nanoimprint was evaluated.

(Preparation of Photocurable Resist for Nanoimprint)

As a resist for nanoimprint, a general acrylic-based resist for photo-nanoimprint was used. The resist was spin applied over a quartz substrate, and the resultant was temporarily baked with a hot plate at 100° C. for 1 minute to obtain a coated film for photo-nanoimprint.

(Photo-Nanoimprint)

As a nanoimprint apparatus, NM-0801HB (manufactured by Meisho Kiko Co., Ltd.) was used.

A used mold was made of silicon, and a pattern dimension was set to 500 nm. Before use, the mold was precedently immersed in Optool (Registered trademark) HD (manufactured by Daikin Industries, Ltd.), was treated using a high-temperature high-humidity apparatus of a temperature of 90° C. and a humidity of 90 RH % for 2 hours, was rinsed with pure water, and was dried by air.

The coated film for photo-nanoimprint attached to the silicon mold was put in the photo-nanoimprint apparatus. The photo-nanoimprint was performed, always under a condition of 23° C., in sequences of: a) compressing up to 1000 N over 10 seconds; b) performing exposure at 500 mJ/cm² using a high pressure mercury lamp; c) decompressing over 10 seconds; and d) separating and releasing the mold and a substrate from each other.

(Evaluation of Planarizing Property on Nanoimprint Substrate)

Each polysiloxane composition for coating of Examples 1 to 4 and Comparative Example 1 was evaluated for a planarizing property as follows. Evaluation results are shown in Table 3.

On the nanoimprint substrate, each polysiloxane composition for coating (coating composition) of Examples 1 to 4 and Comparative Example 1 was coated by using a spin coater under conditions of a rotational speed of 1500 rpm for 60 seconds, and the resultant was dried on a hot plate at 110° C. for 1 minute, so as to form a film of the polysiloxane composition for coating (the coating composition). A thickness of the film of the polysiloxane composition for coating was set to 120 nm. Subsequently, the film of the polysiloxane composition for coating thus obtained was evaluated for a planarizing property by observing a cross-section thereof by the cross-sectional SEM. A thickness of the film was measured in a portion having the smallest thickness and a portion having the largest thickness, a thickness difference was calculated, and a smaller thickness difference was evaluated as a better planarizing property.

TABLE 3

| Example | Coating composition | Thickness difference |
|---|---|---|
| Example 1 | Preparation Example 1 | 27 nm |
| Example 2 | Preparation Example 2 | 23 nm |
| Example 3 | Preparation Example 3 | 23 nm |
| Example 4 | Preparation Example 4 | 24 nm |
| Comparative example 1 | Preparation Example 5 | 37 nm |

In Examples 1 to 4, a plane film having a thickness difference of 30 nm or less, for example, of about 5 to 30 nm, can be formed.

INDUSTRIAL APPLICABILITY

When a modified polysiloxane obtained by capping silanol groups of a polysiloxane to set a ratio of silanol groups to all Si atoms to 40 mol % or less is applied over a stepped substrate as a composition to be applied over a resist pattern, a thickness difference between a portion having the smallest thickness and a portion having the largest thickness can be reduced for planarization. Accordingly, the composition of the present invention can be used as a composition for planarizing a stepped substrate.

The invention claimed is:

1. A composition to be applied over a resist pattern, the composition comprising a modified polysiloxane in which some of silanol groups of a polysiloxane containing a hydrolysis condensate of a hydrolyzable silane are capped, and a solvent, wherein a ratio of silanol groups to all Si atoms contained in the modified polysiloxane is 40 mol % or less.

2. The composition according to claim 1, wherein the ratio of the silanol groups to all the Si atoms is 5 to 40 mol %.

3. The composition according to claim 1, wherein the ratio of the silanol groups to all the Si atoms is 10 to 25 mol %.

4. The composition according to claim 1, wherein the ratio of the silanol groups is adjusted to a desired ratio by reacting the silanol groups of the polysiloxane with an alcohol.

5. The composition according to claim 4, wherein the alcohol is a monohydric alcohol.

6. The composition according to claim 4, wherein the alcohol is 4-methyl-2-pentanol, 1-methoxy-2-propanol, or 2-propanol.

7. The composition according to claim 1, wherein the modified polysiloxane contains a dehydration reaction product of a polysiloxane, an alcohol, and an acid.

8. The composition according to claim 7, wherein the modified polysiloxane is produced by reacting the polysiloxane containing the hydrolysis condensate of the hydrolyzable silane with the alcohol and the acid, and removing water generated through dehydration from a reaction system.

9. The composition according to claim 7, wherein the acid is an acid having an acid dissociation constant of 4 to 5.

10. The composition according to claim 7, wherein the acid is an acid having a boiling point of 70 to 160° C.

11. The composition according to claim 1, wherein the polysiloxane is a hydrolysis condensate of at least one hydrolyzable silane of the following formula (1):

$$R^1_a Si(R^2)_{4-a} \quad \text{Formula (1)}$$

wherein $R^1$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group or a cyano group and bonded to a silicon atom via a Si—C bond; $R^2$ is an alkoxy group, an acyloxy group, or a halogen group; and a is an integer of 0 to 3.

12. The composition according to claim 11, wherein the polysiloxane is a hydrolysis condensate of a hydrolyzable silane (ii) of formula (1), wherein a is 1, or a co-hydrolysis condensate of a hydrolyzable silane (i) of formula (1), wherein a is 0, and the hydrolyzable silane (ii) of formula (1), wherein a is 1.

13. The composition according to claim 12, wherein the polysiloxane has a molar ratio of the hydrolyzable silane (i): the hydrolyzable silane (ii) of 0:100 to 50:50.

14. The composition according to claim 1, to be applied over a resist pattern.

15. The composition according to claim 1, to be applied over a line and space resist pattern.

16. The composition according to claim 1, wherein the resist pattern is a pattern formed by nanoimprint.

17. A method for producing a semiconductor device, comprising: a step (1) of forming a resist film on a substrate, a step (2) of forming a resist pattern by exposing and subsequently developing the resist film, a step (3) of applying the composition according to claim 1 over the resist pattern during or after development, and a step (4) of reversing a pattern by removing the resist pattern by etching.

18. The production method according to claim 17, comprising, before the step (1), a step (1-1) of forming a resist underlayer film on the substrate.

19. The production method according to claim 17, comprising, after the step (3), a step (3-1) of etching back a surface of a coated film of a cured substance of the composition to expose a surface of the resist pattern.

* * * * *